United States Patent
Fujishima et al.

(10) Patent No.: US 6,239,231 B1
(45) Date of Patent: May 29, 2001

(54) CHEMICAL AMPLIFYING TYPE POSITIVE RESIST COMPOSITION

(75) Inventors: Hiroaki Fujishima; Yasunori Uetani, both of Toyonaka; Karou Araki, Kyoto, all of (JP)

(73) Assignee: Sumitomo Chemical, Company Limited, Osaka (JP)

( * ) Notice: Subject to any disclaimer, the term of this patent is extended or adjusted under 35 U.S.C. 154(b) by 0 days.

(21) Appl. No.: 09/384,032

(22) Filed: Aug. 26, 1999

(30) Foreign Application Priority Data

Aug. 26, 1998 (JP) .................................................. 10-240143

(51) Int. Cl.[7] ....................................................... C08F 8/00
(52) U.S. Cl. .................. 525/337; 525/326.8; 525/326.9; 525/327.4; 525/327.5; 525/327.6; 525/328.8; 525/340; 525/341; 525/343; 525/348; 525/351; 526/270; 526/281
(58) Field of Search ..................................... 526/270, 281; 525/337, 340, 341, 343, 348, 351

(56) References Cited

U.S. PATENT DOCUMENTS 5,474,872  12/1995  Tomo et al. .
5,738,975  4/1998  Nakano et al. .

FOREIGN PATENT DOCUMENTS

| 196 26 003 | 1/1997 | (DE) . |
| 0663616 | 7/1995 | (EP) . |
| 0856773 | 8/1998 | (EP) . |
| 0887706 | 12/1998 | (EP) . |
| 0915382 | 5/1999 | (EP) . |
| 0930542 | 7/1999 | (EP) . |
| 63-33350 | 2/1988 | (JP) . |
| 10-182552 | 7/1998 | (JP) . |
| 10-207069 | 8/1998 | (JP) . |

Primary Examiner—Bernard Lipman
(74) Attorney, Agent, or Firm—Birch, Stewart, Kolasch & Birch, LLP

(57) ABSTRACT

A chemical amplifying type positive resist composition, excellent in adhesion to a substrate and good in resist performances and suitable for exposure using a KrF excimer laser, ArF excimer laser, or the like, which comprises a resin having a polymerization unit of 2-alkyl-2-adamantyl (meth) acrylate and a polymerization unit of a monomer selected from 3-hydroxy-1-adamantyl (meth)acrylate and (meth) acrylonitrile, and an acid generator is provided.

16 Claims, No Drawings

CHEMICAL AMPLIFYING TYPE POSITIVE RESIST COMPOSITION

FIELD OF THE INVENTION

The present invention relates to a chemical amplifying type positive resist composition used in the minute processing of a semiconductor.

PRIOR ART

A lithography process using a resist composition has been adopted in the minute processing of a semiconductor. In the lithography processing, the resolution can be improved with a decrease in wavelength of exposure light in principle as expressed by the expression of Rayleigh's diffraction limited. A g-line with a wavelength of 436 nm, an i-line with a wavelength of 365 nm, and a KrF excimer laser with a wavelength of 248 nm have been adopted as exposure light sources for lithography used in the manufacture of a semiconductor. Thus, the wavelength of the exposure light source has become shorter year by year. An ArF excimer laser having a wavelength of 193 nm is considered to be promising as a next-generation exposure light source.

A lens used in an ArF excimer laser exposure machine has a shorter lifetime as compared with lenses for conventional exposure light sources. Accordingly, the shorter time required for exposure to ArF excimer laser light in the lithography process is desirable, and, for reducing the exposure time, higher sensitivity of a resist has been desired. Consequently, there has been used a so-called chemical amplifying type resist, which utilizes the catalytic action of an acid generated due to exposure, and contains a resin having a group cleavable by the action of an acid.

It is desirable that resins used in a resist for ArF excimer laser exposure have no aromatic ring in order to ensure the transmittance of the resist, but have an alicyclic ring in order to impart a dry etching resistance thereto. Various kinds of resins such as those described in Journal of Photopolymer Science and Technology, Vol. 9, No. 3, pages 387–398 (1996) by D. C. Hofer, are known for the resins usable in a resist for ArF excimer laser exposure. However, conventionally known resins have a problem that peeling off of a pattern tends to occur due to insufficient adhesion at development.

Journal of Photopolymer Science and Technology, Vol. 9, No. 3, pages 475–487 (1996) by S. Takechi et al., and JP-A-9-73173 reported that high dry etching resistance and high resolution as well as good adhesion to a substrate can be attained by using a chemical amplifying type resist comprising a polymer or copolymer of 2-methyl-2-adamantyl methacrylate as the resin, in which 2-methyl-2-adamantyl is cleaved by the action of an acid to act as an positive type.

SUMMARY OF THE INVENTION

An object of the present invention is to provide a chemical amplifying type positive resist composition which comprises a resin component and an acid generator, and is suitable for excimer laser lithography of ArF, KrF, or the like, wherein various resist performances such as sensitivity and resolution are good and especially the adhesion to a substrate is excellent.

The present inventors have previously discovered that the adhesion to a substrate is improved by using a chemical amplifying type positive resist composition comprising a resin having a butyrolactone residue in a part of its polymerization unit, or a resin having a polymerization unit of 2-alkyl-2-adamantyl (meth)acrylate and a polymerization unit of maleic anhydride, and have filed patent applications as JP-A-10-12406 and JP-A-10-191559. The present inventors have further conducted a study, and, as a result, have found that resins having a polymerization unit of a specific structure of adamantane series and a certain high polarity polymerization unit are effective for improving the adhesion to a substrate. Thus, the present invention was completed.

The present invention provides a chemical amplifying type positive resist composition which comprises a resin(1) having a polymerization unit of 2-alkyl-2-adamantyl (meth)acrylate, and a polymerization unit of a monomer selected from 3-hydroxy-1-adamantyl (meth)acrylate and (meth)acrylonitrile; and an acid generator.

The polymerization unit of 2-alkyl-2-adamantyl (meth)acrylate herein cited means a unit in the polymer formed by the polymerization of 2-alkyl-2-adamantyl acrylate or 2-alkyl-2-adamantyl methacrylate. The polymerization unit of 3-hydroxy-1-adamantyl (meth)acrylate means a unit in the polymer formed by the polymerization of 3-hydroxy-1-adamantyl acrylate or 3-hydroxy-1-adamantyl methacrylate. Further, the polymerization unit of (meth)acrylonitrile means a unit in the polymer formed by the polymerization of acrylonitrile or methacrylonitrile. These units are represented by the following formulae (I) to (III), respectively:

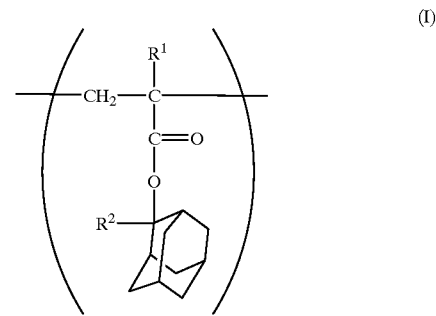

wherein $R^1$ represents hydrogen or methyl, and $R^2$ represents alkyl.

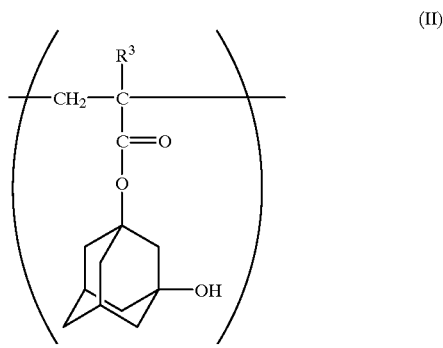

wherein $R^3$ represents hydrogen or methyl.

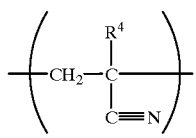
(III)

wherein $R^4$ represents hydrogen or methyl.

Therefore, the resin(1) has the unit of the above-described formula (I), and one or both of the units of the above-described formulae (II) and (III). The resin(1) may also have a polymerization unit of α-methacryloyloxy-γ-butyrolactone or a polymerization unit of maleic anhydride. The polymerization unit of α-methacryloyloxy-γ-butyrolactone herein cited means a unit in the polymer formed by the polymerization of α-methacryloyloxy-γ-butyrolactone. The polymerization unit of maleic anhydride means a unit in the polymer formed by the polymerization of maleic anhydride. These units are represented by the following formulae (IV) and (V), respectively:

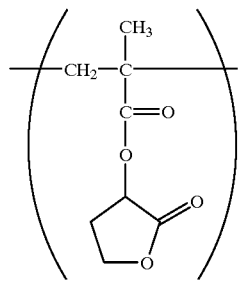
(IV)

(V)

Among the polymerization units of 2-alkyl-2-adamantyl (meth)acrylate represented by the formula (I), the polymerization unit in which $R^1$ is methyl, and $R^2$ is ethyl, i.e., the polymerization unit of 2-ethyl-2-adamantyl methacrylate represented by the following formula (Ia) is important.

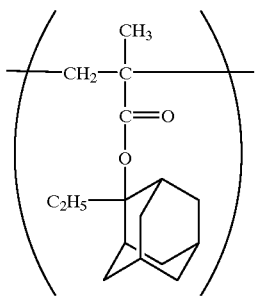
(Ia)

This polymerization unit of 2-ethyl-2-adamantyl methacrylate of formula (Ia) can be combined with at least one of the polymerization units selected from the polymerization unit of 3-hydroxy-1-adamantyl (meth)acrylate represented by the above-described formula (II), the polymerization unit of (meth)acrylonitrile represented by the above-described formula (III), the polymerization unit of α-methacryloyloxy-γ-butyrolactone represented by the above-described formula (IV), and the polymerization unit of maleic anhydride represented by the above-described formula (V) to form a resin usable in a chemical amplifying type positive resist. Therefore, the present invention also provides a chemical amplifying type positive resist composition which comprises a resin(2) having a polymerization unit of 2-ethyl-2-adamantyl methacrylate, and a polymerization unit of a monomer selected from 3-hydroxy-1-adamantyl (meth)acrylate, (meth)acrylonitrile, α-methacryloyloxy-γ-butyrolactone, and maleic anhydride; and an acid generator. That is, the resin(2) has the unit of the formula (Ia), and one or a plurality of the units of the formulae (II), (III), (IV), and (V).

DETAILED DESCRIPTION OF THE PREFERRED EMBODIMENTS

The resin(1) has the polymerization unit of 2-alkyl-2-adamantyl (meth)acrylate represented by the formula (I), and one or both of the polymerization unit of 3-hydroxy-1-adamantyl (meth)acrylate represented by the formula (II) and the polymerization unit of (meth)acrylonitrile represented by the formula (III). The resin(1) may optionally have the polymerization unit of α-methacryloyloxy-γ-butyrolactone represented by the formula (IV) and/or the polymerization unit of maleic anhydride represented by the formula (V). Therefore, the resin(1) can be produced by conducting a copolymerization of 2-alkyl-2-adamantyl (meth)acrylate, and one or both of 3-hydroxy-1-adamantyl (meth)acrylate and (meth)acrylonitrile, and optionally α-methacryloyloxy-γ-butyrolactone and/or maleic anhydride.

Among these monomers, 2-alkyl-2-adamantyl (meth)acrylate can generally be produced by the reaction of 2-alkyl-2-adamantanol or a metallic salt thereof and acrylic acid halide or methacrylic acid halide. 3-Hydroxy-1-adamantyl (meth)acrylate can be produced by hydrolyzing 1,3-dibromoadamantane to prepare 1,3-dihydroxyadamantane which is then reacted with acrylic acid, methacrylic acid or halide thereof.

The polymerization unit of 2-alkyl-2-adamantyl (meth) acrylate represented by the formula (I) ensures the transmittance of a resist and contributes to the improvement of dry etching resistance due to the presence of an adamantane ring. Further, the 2-alkyl-2-adamantyl in this unit is cleaved by the action of an acid, and hence this unit contributes to the enhancement of alkali-solubility after exposure of a resist film. $R^2$ in the formula (I) is alkyl. This alkyl may have, for example, about 1 to 8 carbon atoms. In general, the alkyl is advantageously straight chain, but it may be branched when the number of carbons is 3 or more. Examples of $R^2$ include methyl, ethyl, n-propyl, isopropyl, and n-butyl. Among these examples, methyl or ethyl, particularly ethyl, is preferred as $R^2$ for the improvement of adhesion between a resist and a substrate, and for the improvement of resolution. A resist comprising the resin(1) of formula (I) wherein $R^1$ is methyl and $R^2$ is ethyl exhibits particularly high adhesion to a substrate.

The resin(2) has the polymerization unit of 2-ethyl-2-adamantyl methacrylate represented by the formula (Ia), and at least one of the polymerization units selected from the polymerization unit of 3-hydroxy-1-adamantyl (meth) acrylate represented by the formula (II), the polymerization unit of (meth)acrylonitrile represented by the formula (III), the polymerization unit of α-methacryloyloxy-γ-butyrolactone represented by the formula (IV), and the polymerization unit of maleic anhydride represented by the formula (V). Therefore, the resin(2) can be produced by conducting a copolymerization of 2-ethyl-2-adamantyl methacrylate and at least one of the monomers selected from 3-hydroxy-1-adamantyl (meth)acrylate, (meth)acrylonitrile, α-methacryloyloxy-γ-butyrolactone, and maleic anhydride.

2-Ethyl-2-adamantyl methacrylate can be produced by the reaction of 2-ethyl-2-adamantanol or a metallic salt thereof, and methacrylic acid halide. For example, ethyl lithium is allowed to react with 2-adamantanone to form lithium 2-ethyl-2-adamanetanolate. The resulting lithium 2-ethyl-2-adamanetanolate is subjected to condensation with methacrylic acid halide to obtain 2-ethyl-2-adamantyl methacrylate.

The polymerization unit of 3-hydroxy-1-adamantyl (meth)acrylate represented by the formula (II), the polymerization unit of (meth)acrylonitrile represented by the formula (III), the polymerization unit of α-methacryloyloxy-γ-butyrolactone represented by the formula (IV), and the polymerization unit of maleic anhydride represented by the formula (V) have high polarity. The presence of any of these polymerization units in a resin(2) contributes to the improvement of the adhesion of a resist comprising the resin(2) to a substrate. Particularly, the polymerization unit of α-methacryloyloxy-γ-butyrolactone of formula (IV) is excellent in effect of adhesion improvement. The polymerization unit of α-methacryloyloxy-γ-butyrolactone exhibits a remarkable effect in combination with the polymerization unit of 2-ethyl-2-adamantyl methacrylate represented by the formula (Ia).

The polymerization unit of 2-alkyl-2-adamantyl (meth)acrylate of formula (I) also exhibits a remarkable effect in combination with the polymerization unit of 3-hydroxy-1-adamantyl (meth)acrylate or the polymerization unit of (meth)acrylonitrile. Further, among the above-described units, the polymerization unit of 3-hydroxy-1-adamantyl (meth)acrylate, the polymerization unit of (meth)acrylonitrile and the polymerization unit of maleic anhydride also contribute to the improvement of the dry etching resistance of a resist. Whereas the polymerization unit of 3-hydroxy-1-adamantyl (meth)acrylate and the polymerization unit of α-methacryloyloxy-γ-butyrolactone also contribute to the improvement of the resolution of the resist.

A resin for a chemical amplifying type positive resist itself is generally alkali-insoluble or alkali-slightly soluble. However, a part of a group therein is cleaved by the action of an acid, and the resin becomes alkali-soluble after the cleavage. In the resin(1) or (2) specified in the present invention, 2-alkyl-2-adamantyl in the formula (I) or 2-ethyl-2-adamantyl in the formula (Ia) is cleaved by the action of an acid. Therefore, the presence of the polymerization unit of the formula (I) or (Ia) in the resin(1) or (2) causes a resist composition comprising the resin to act as a positive type. If required, the resin may also comprises other polymerization units having a group which are cleaved by the action of an acid.

Examples of the group in the other polymerization units which are cleaved by the action of an acid include various esters of carboxylic acid. Examples of the esters of carboxylic acid include alkyl esters such as tert-butyl ester, acetal type esters such as methoxymethyl ester, ethoxymethyl ester, 1-ethoxyethyl ester, 1-isobutoxyethyl ester, 1-isopropoxyethyl ester, 1-ethoxypropyl ester, 1-(2-methoxyethoxy)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester, and alicyclic esters such as isobornyl ester. Examples of the monomers used for producing the polymer having a unit having such carboxylic acid esters include acrylic monomers such as methacrylate and acrylate, and the ones in which carboxylic acid ester groups are bonded to alicyclic monomers such as norbornene carboxylate, tricyclodecene carboxylate, and tetracyclodecene carboxylate.

The resin(1) or (2) preferably contains the polymerization unit having a group which is cleaved by the action of an acid in an amount in the range of 30 to 80 mol % in general, although the preferable amount may vary depending upon the kind of the radioactive ray for patterning exposure and the kind of the group which is cleaved by the action of an acid.

The amount of the polymerization unit of 2-alkyl-2-adamantyl (meth)acrylate represented by the formula (I), the polymerization unit of 2-ethyl-2-adamantyl methacrylate of formula (Ia) being an example thereof, is preferably 20 mol % or more based on the total amount of the resin. The total amount of the polymerization units of formula (I) and the other polymerization unit having a group which is cleaved by the action of an acid is preferably 30 to 80 mol % based on the total amount of the resin, as mentioned above. It is more preferable that the amount of the polymerization unit of 2-ethyl-2-adamantyl methacrylate of formula (Ia) is 20 mol % or more and the total amount of the polymerization unit of formula (I) is 30 to 80 mol % based on the total amount of the resin.

The total amount of the polymerization unit of 3-hydroxy-1-adamantyl (meth)acrylate represented by the formula (II), the polymerization unit of (meth)acrylonitrile represented by the formula (III), the polymerization unit of α-methacryloyloxy-γ-butyrolactone represented by the formula (IV), and the polymerization unit of maleic anhydride represented by the formula (V) is preferably in an amount in the range of 20 to 70 mol % in the resin(1) or (2). In the resin(1), the total amount of the polymerization unit of 3-hydroxy-1-adamantyl (meth)acrylate and/or the polymerization unit of (meth)acrylonitrile is preferably 20 mol % or more. When the polymerization unit of α-methacryloyloxy-γ-butyrolactone and/or the polymerization unit of maleic anhydride is optionally introduced therein, the total amount of the polymerization unit of 3-hydroxy-1-adamantyl (meth)acrylate, the polymerization unit of (meth)acrylonitrile, the polymerization unit of α-methacryloyloxy-γ-butyrolactone and the polymerization unit of maleic anhydride is preferably 70 mol % or less. The resin(1) and resin(2) can also contain other polymerization units such as the polymerization unit having a free carboxylic acid group in such a range as not to impair the effect of the present invention.

The acid generator which is another component in the resist composition of the present invention is decomposed to generate an acid by irradiating the component itself or a resist composition including the component with radioactive rays such as light and an electron beam. The acid generated from the acid generator acts on the resin in the resist composition to cleave the group present in the resin which is to be cleaved by the action of an acid. Examples of such acid generators include onium salts, organic halogens, sulfones, and sulfonates. Specifically, the following compounds can be mentioned:

diphenyliodonium trifluoromethanesulfonate,
4-methoxyphenylphenyliodonium hexafluoroantimonate, 4-methoxyphenylphenyliodonium
   trifluoromethanesulfonate,
bis(4-tert-butylphenyl)iodonium tetrafluoroborate,
bis(4-tert-butylphenyl)iodonium hexafluorophosphate,
bis (4-tert-butylphenyl)iodonium hexafluoroantimonate,
bis (4-tert-butylphenyl)iodonium trifluoromethanesulfonate,
triphenylsulfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium
   trifluoromethanesulfonate,
p-tolyldiphenylsulfonium trifluoromethanesulfonate,
p-tolyldiphenylsulfonium perfluoroctanesulfonate,
2,4,6-trimethylphenyldiphenylsulfonium
   trifluoromethanesulfonate,
4-tert-butylphenyldiphenylsulfonium
   trifluoromethanesulfonate,
4-phenylthiophenyldiphenylsulfonium
   hexafluorophosphate,
4-phenylthiophenyldiphenylsulfonium
   hexafluoroantimonate,
1-(2-naphthoylmethyl)thiolanium hexafluoroantimonate,
1-(2-naphthoylmethyl)thiolanium
   trifluoromethanesulfonate,
4-hydroxy-1-naphthyldimethylsulfonium
   hexafluoroantimonate,
4-hydroxy-1-naphthyldimethylsulfonium
   trifluoromethanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-
   triazine,
2-(4-methoxy-1-naphthyl)-4,6-bis(trichloromethyl)-1,3,5-
   triazine,
2-(benzo[d][1,3]dioxolane-5-yl)-4,6-bis(trichloromethyl)-1,
   3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-
   triazine,
2-(3,4-dimethoxystyryl)-4,6-bis(trichloromethyl)-1,3,5-
   triazine,
2-(2,4-dimethoxystyryl)-4,6-bis(trichloromethyl)-1,3,5-
   triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-
   triazine,
1-benzoyl-1-phenylmethyl p-toluenesulfonate (so-called
   benzointosylate),
2-benzoyl-2-hydroxy-2-phenylethyl p-toluenesulfonate (so-
   called α-methylolbenzointosylate),
1,2,3-benzenetriyl trismethanesulfonate,
2,6-dinitrobenzyl p-toluenesulfonate,
2-nitrobenzyl p-toluenesulfonate,
4-nitrobenzyl p-toluenesulfonate,
diphenyl disulfone,
di-p-tolyl disulfone,
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane, N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-
   dicarboxyimide,
N-(trifluoromethylsulfonyloxy)naphthalimide,
N-(10-camphorsulfonyloxy)naphthalimide, and the like.

Generally in a chemical amplifying type positive resist composition, performance deterioration due to the deactivation of an acid associated with leaving after exposure can be reduced by adding basic compounds, especially basic nitrogen-containing organic compounds such as amines as quenchers. It is also preferable in the present invention that such basic compounds are added. Examples of the basic compounds to be used as quenchers include the ones represented by the following formulae:

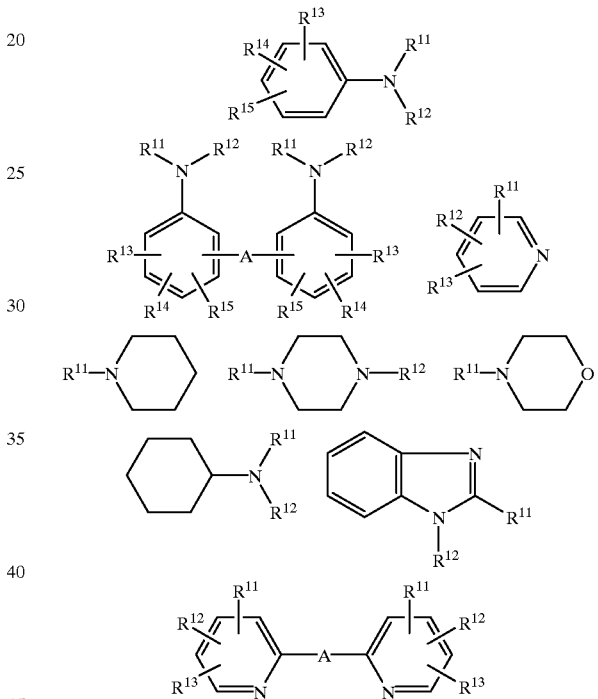

wherein $R^{11}$, $R^{12}$, $R^{13}$, $R^{14}$, and $R^{15}$ each independently represent hydrogen, or alkyl, cycloalkyl, aryl, or alkoxy which may be optionally substituted by a hydroxyl group, and A represents alkylene, carbonyl, or imino. The alkyl and alkoxy herein represented by $R^{11}$ to $R^{15}$ each may have about 1 to 6 carbon atoms, the cycloalkyl may have about 5 to 10 carbon atoms, and the aryl may have about 6 to 10 carbon atoms. The alkylene represented by A may have about 1 to 6 carbon atoms, and it may be straight-chain or branched.

The resist composition of the present invention preferably contains a resin in an amount of 80 to 99.9% by weight, and an acid generator in an amount of 0.1 to 20% by weight based on the total solid component weight of the composition. When a basic compound is used as a quencher, it is preferably contained in an amount in the range of 0.0001 to 0.1% by weight based on the total solid component weight of the resist composition. The composition may also contain, if required, various additives such as sensitizers, dissolution inhibitors, other resins, surfactants, stabilizers, and dyes in small amounts.

The resist composition of the present invention is dissolved in a solvent to produce a resist solution, which is to be applied on a substrate such as a silicon wafer. The solvent herein used may be one which dissolves each component, has an appropriate drying rate, and provide a uniform and smooth coating after evaporation of the solvent, and can be one which is generally used in this field. Examples thereof include glycol ether esters such as ethylcellosolve acetate, methylcellosolve acetate and propylene glycol monomethyl ether acetate; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents can be used alone or in combination of two or more thereof.

The resist film applied on a substrate and dried is subjected to an exposure treatment for patterning. Then, after a heat-treatment for promoting a protecting deblocking reaction, development by an alkali developer is conducted. The alkali developer herein used can be various kinds of alkaline aqueous solution used in this field. An aqeous solution of tetramethylammoniumhydroxide or (2-hydroxyethyl)trimethylammoniumhydroxide (so-called colline hydroxide) is generally used.

EXAMPLE

The present invention will be described in more detail by way of examples, which should not be construed as limiting the scope of the present invention. All parts in examples are by weight unless otherwise stated. The weight-average molecular weight is a value determined from gel permeation chromatography using polystyrene as a reference standard.

Monomer Synthesis Example 1

Synthesis of 2-methyl-2-adamantyl methacrylate 83.1 g of 2-methyl-2-adamantanol and 101 g of triethylamine were charged, and 200 g of methyl isobutyl ketone was added thereto to prepare a solution. Then, 78.4 g of methacrylic acid chloride (1.5 mole times with respect to 2-methyl-2-adamantanol) was added dropwise thereto, followed by stirring at room temperature for 10 hours. After filtration, the organic layer was washed with a 5% by weight aqueous solution of sodium bicarbonate, followed by washing with water for 2 times. The organic layer was concentrated, and then subjected to distillation under reduced pressure to obtain 2-methyl-2-adamantyl methacrylate represented by the following formula in a 75% yield.

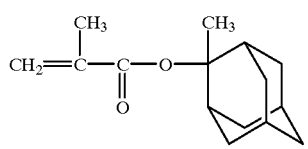

Monomer Synthesis Example 2

Synthesis of 2-ethyl-2-adamantyl methacrylate 50 g of diethyl ether was added to 31.1 g of 2-adamantanone to prepare a solution. Then, 200 ml of a diethyl ether solution containing ethyl lithium in a concentration of 1.14 mole/L was added dropwise thereto at such a rate as to keep the temperature of the solution not exceeding 10° C. After stirring the solution thus obtained at 0° C. for 2 hours, 26.2 g of methacrylic acid chloride (1.2 mole times with respect to 2-adamantanone) was added dropwise thereto at such a rate as to keep the temperature not exceeding 10° C. After the completion of dropwise addition, the resulting solution was stirred at room temperature for 12 hours. Thereafter, the deposited inorganic salts were separated by filtration, and the organic layer was washed with a 5% by weight aqueous solution of sodium bicarbonate, followed by washing with water for 2 times. The organic layer was concentrated, and then subjected to distillation under reduced pressure to obtain 2-ethyl-2-adamantyl methacrylate represented by the following formula in a 60% yield.

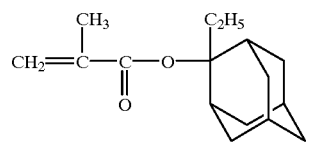

Monomer Synthesis Example 3

Synthesis of α-methacryloyloxy-γ-butyrolactone 100 g of α-bromo-γ-butyrolactone and 104.4 g of methacrylic acid (2.0 mole times with respect to α-bromo-γ-butyrolactone) were charged, and methyl isobutyl ketone was added thereto in an amount of 3 weight times that of α-bromo-γ-butyrolactone to prepare a solution. Then, 183.6 g of triethylamine (3.0 mole times with respect to α-bromo-γ-butyrolactone) was added dropwise thereto, followed by stirring at room temperature for about 10 hours. After filtration, an organic layer was washed with 5% by weight aqueous solution of sodium bicarbonate, followed by washing with water for 2 times. The organic layer was concentrated to obtain α-methacryloyloxy-γ-butyrolactone represented by the following formula in a 85% yield.

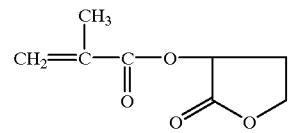

Resin Synthesis Example 1

Synthesis of Resin A

2-Methyl-2-adamantyl methacrylate, 3-hydroxy-1-adamantyl methacrylate and α-methacryloyloxy-γ-butyrolactone were charged in a mole ratio of 5:2.5:2.5 (20.0 g:10.1 g:7.8 g), respectively. Then, methyl isobutyl ketone was added in an amount of 2 weight times based on the total amount of monomers to prepare a solution. As an initiator, azobisisobutyronitrile was added thereto in an amount of 2 mol % based on the total amount of monomers, followed by heating at 85° C. for about 8 hours. Thereafter, the operation of pouring the reaction solution into a large amount of heptane to cause precipitation was repeated 3 times, thus the solution was purified. As a result, a copolymer represented by the following formula, and having a composition mole ratio of each unit of 50:25:25, and having a weight-average molecular weight of about 4,500 was obtained. The resulting copolymer is referred to as a resin A.

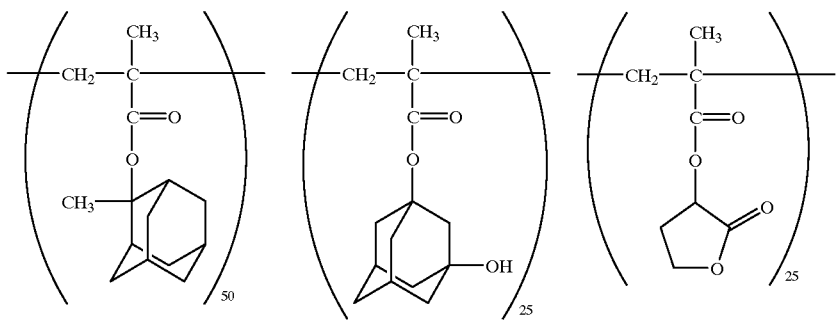

Resin Synthesis Example 2

Synthesis of Resin B

2-Methyl-2-adamantyl methacrylate, methacrylonitrile and maleic anhydride were charged in a mole ratio of 5:2.5:2.5 (20.0 g:3.1 g:4.5 g), respectively. Then, tetrahydrofuran was added in an amount of 2 weight times based on the total amount of monomers to prepare a solution. As an initiator, azobisisobutyronitrile was added thereto in an amount of 2 mol % based on the total amount of monomers, followed by heating at 60° C. for about 12 hours. Thereafter, the operation of pouring the reaction solution into a large amount of heptane to cause precipitation was repeated 3 times, thus the solution was purified. As a result, a copolymer represented by the following formula, and having a composition mole ratio of each unit of 50:25:25, and having a weight-average molecular weight of about 8,000 was obtained. The resulting copolymer is referred to as resin B.

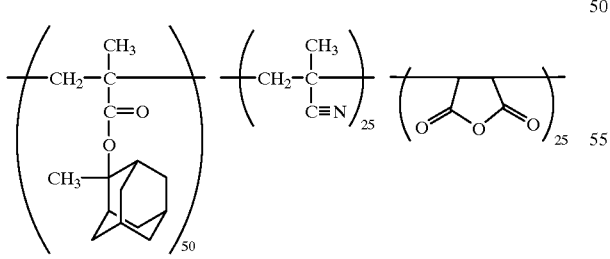

Resin Synthesis Example 2-2

Similarly, 2-methyl-2-adamantyl methacrylate, methacrylonitrile and α-methacryloyloxy-γ-butyrolactone are copolymerized to give a ternary copolymer having their respective polymerization units.

Resin Synthesis Example 3

Synthesis of Resin C

The same operations as in the resin synthesis example 1 were conducted, except that 2-methyl-2-adamantyl methacrylate, 3-hydroxy-1-adamantyl methacrylate and α-methacryloyloxy-γ-butyrolactone were replaced with 2-ethyl-2-adamantyl methacrylate, 3-hydroxy-1-adamantyl methacrylate and α-methacryloyloxy-γ-butyrolactone in a mole ratio of 5:2.5:2.5 (20.0 g:9.5 g:7.3 g), respectively. As a result, a copolymer represented by the following formula, and having a composition mole ratio of each unit of 50:25:22, and having a weight-average molecular weight of about 9,200 was obtained. The resulting copolymer is referred to as resin C.

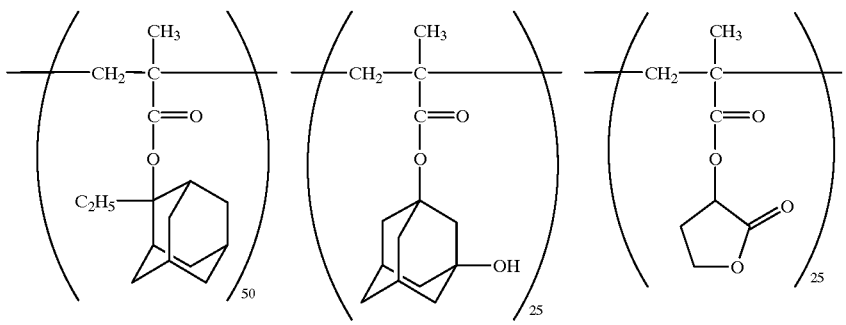

Resin Synthesis Example 4

Synthesis of Resin D

The same operations as in the resin synthesis example 2 were conducted, except that 2-methyl-2-adamantyl methacrylate, methacrylonitrile and maleic anhydride were replaced with 2-ethyl-2-adamantyl methacrylate, 3-hydroxy-1-adamantyl methacrylate and maleic anhydride in a mole ratio of 5:2.5:2.5 (20.0 g:9.5 g:4.2 g), respectively. As a result, a copolymer represented by the following formula, and having a composition mole ratio of each unit of 50:25:25, and having a weight-average molecular weight of about 17,000 was obtained. The resulting copolymer is referred to as resin D.

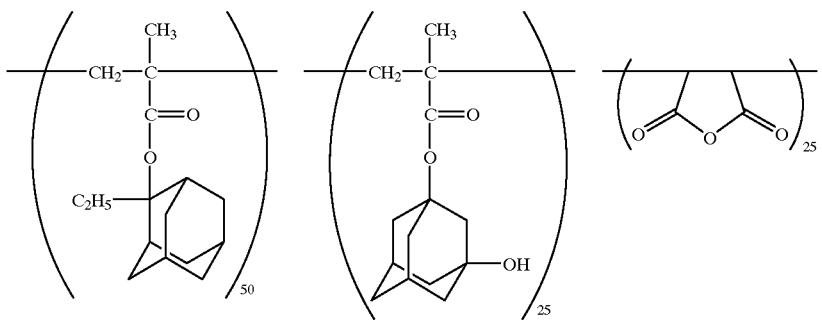

Resin Synthesis Example 5

Synthesis of Resin E

The same operations as in the resin synthesis example 2 were conducted, except that 2-methyl-2-adamantyl methacrylate, methacrylonitrile and maleic anhydride were replaced with 2-ethyl-2-adamantyl methacrylate, methacrylonitrile and maleic anhydride in a mole ratio of 5:2.5:2.5 (20.0 g:2.9 g:4.2 g), respectively. As a result, a copolymer represented by the following formula, and having a composition mole ratio of each unit of 50:25:25, and having a weight-average molecular weight of about 3,400 was obtained. The resulting copolymer is referred to as resin E.

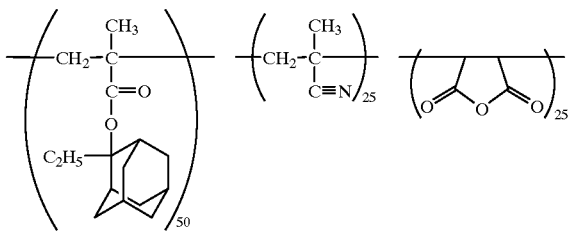

Resin Synthesis Example 6

Synthesis of Resin F

The same operations as in the resin synthesis example 1 were conducted, except that 2-methyl-2-adamantyl methacrylate, 3-hydroxy-1-adamantyl methacrylate and α-methacryloyloxy-γ-butyrolactone were replaced with 2-ethyl-2-adamantyl methacrylate, methacrylonitrile and α-methacryloyloxy-γ-butyrolactone in a mole ratio of 5:2.5:2.5 (20.0 g:2.9 g:7.3 g), respectively. As a result, a copolymer represented by the following formula, and having a composition mole ratio of each unit of 50:25:25, and having a weight-average molecular weight of about 6,000 was obtained. The resulting copolymer is referred to as resin F.

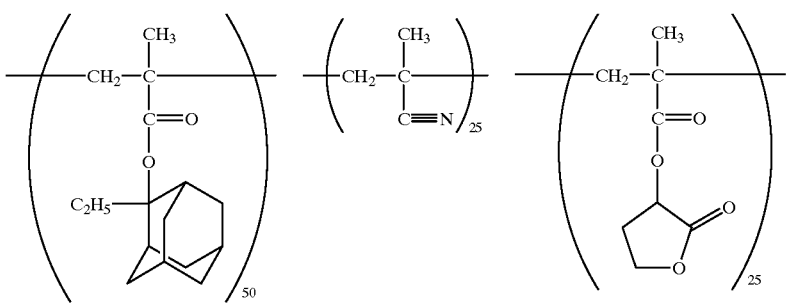

Resin Synthesis Example 7

Synthesis of Resin G

The same operations as in the resin synthesis example 1 were conducted, except that 2-methyl-2-adamantyl methacrylate, 3-hydroxy-1-adamantyl methacrylate and α-methacryloyloxy-γ-butyrolactone were replaced with 2-ethyl-2-adamantyl methacrylate and α-methacryloyloxy-γ-butyrolactone in a mole ratio of 5:5 (40.0 g:29.3 g), respectively. As a result, a copolymer represented by the following formula, and having a composition mole ratio of each unit of 50:50, and having a weight-average molecular weight of about 5,600 was obtained. The resulting copolymer is referred to as resin G.

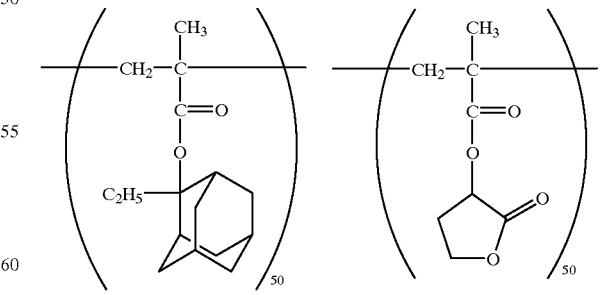

Resin Synthesis Example 8

Synthesis of Resin H 2-ethyl-2-adamantyl methacrylate, 3-hydroxy-1-adamantyl methacrylate and methacrylonitrile were charged in a mole ratio of 5:2.5:2.5 (20.0 g:9.5 g:2.9 g), respectively. Then, tetrahydrofuran was added in an amount of 2 weight times based on the total amount of monomers to prepare a solution. As an initiator, azobisisobutyronitrile was added thereto in an amount of 2 mol % based on the total amount of monomers, followed by heating at 65° C. for about 12 hours. Thereafter, the operation of pouring the reaction solution into a large amount of heptane to cause precipitation was repeated 3 times, thus the solution was purified. As a result, a copolymer represented by the following formula, and having a composition mole ratio of each unit of 50:25:25, and having a weight-average molecular weight of about 14,000 was obtained. The resulting copolymer is referred to as resin H.

Resin Synthesis Example 10

Synthesis of Resin X, for Comparison

The same operations as in the resin synthesis example 1 were conducted, except that 2-methyl-2-adamantyl methacrylate, 3-hydroxy-1-adamantyl methacrylate and α-methacryloyloxy-γ-butyrolactone were replaced with 2-methyl-2-adamantyl methacrylate and α-methacryloyloxy-γ-butyrolactone in a mole ratio of 5:5 (15.0 g:11.7 g), respectively. As a result, a copolymer represented by the following formula, and having a composition mole ratio of each unit of 50:50, and having a weight-average molecular weight of about 10,000 was obtained. The resulting copolymer is referred to as resin X.

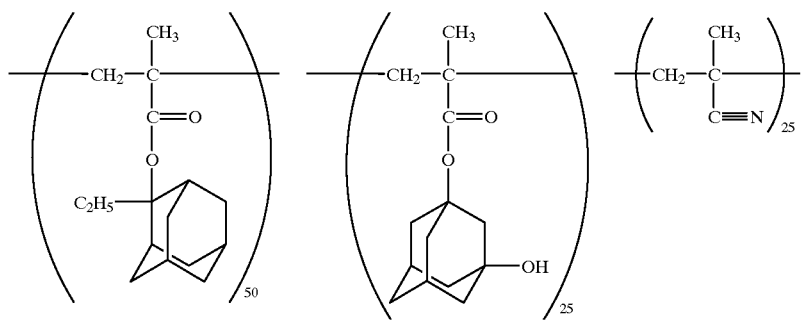

Resin Synthesis Example 9

Synthesis of Resin I 2-ethyl-2-adamantyl methacrylate, 2-methyl-2-adamantyl methacrylate and α-methacryloyloxy-γ-butyrolactone were charged in a mole ratio of 2.5:2.5:5 (10.6 g:10.0 g:15.6 g), respectively. Then, methyl isobutyl ketone was added in an amount of 2 weight times based on the total amount of monomers to prepare a solution. As an initiator, azobisisobutyronitrile was added thereto in an amount of 2 mol % based on the total amount of monomers, followed by heating at 85° C. for about 6 hours. Thereafter, the operation of pouring the reaction solution into a large amount of heptane to cause precipitation was repeated 3 times, thus the solution was purified. As a result, a copolymer represented by the following formula, and having a composition mole ratio of each unit of 25:25:50, and having a weight-average molecular weight of about 9,000 was obtained. The resulting copolymer is referred to as resin I.

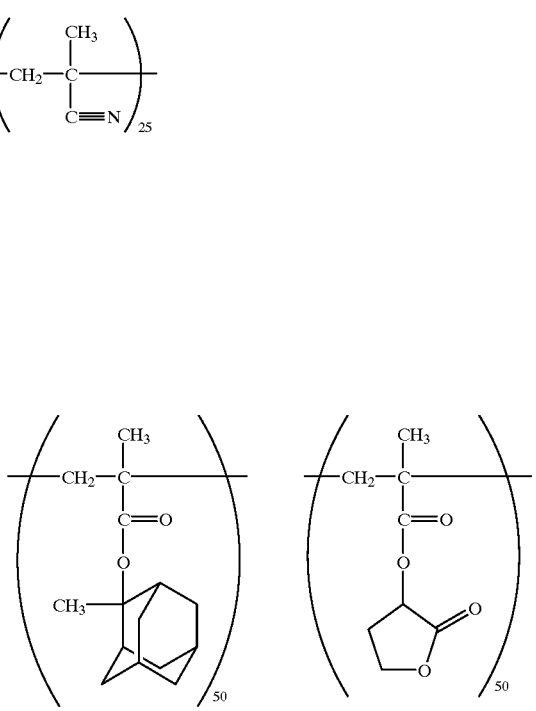

Resin Synthesis Example 11

Synthesis of Resin J 2-ethyl-2-adamantyl methacrylate, 3-hydroxy-1-adamantyl methacrylate and α-methacryloyloxy-γ-

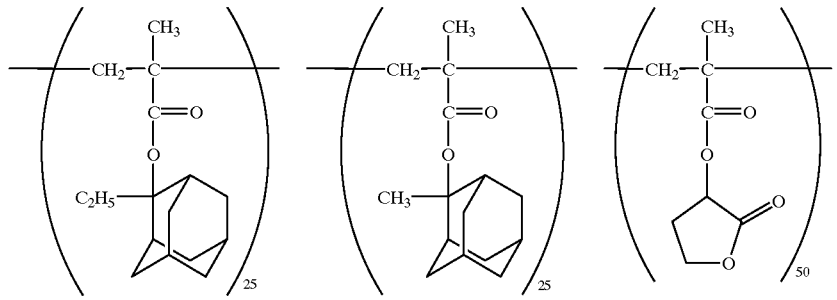

butyrolactone were charged in a mole ratio of 5.0:2.5:2.5 (20.0 g:8.9 g:6.8 g), respectively. Then, methyl isobutyl ketone was added in an amount of 2 weight times based on the total amount of monomers to prepare a solution. As an initiator, azobisisobutyronitrile was added thereto in an amount of 2 mol % based on the total amount of monomers, followed by heating at 85° C. for about 5 hours. Thereafter, the operation of pouring the reaction solution into a large amount of heptane to cause precipitation was repeated 3 times, thus the solution was purified. As a result, a copolymer represented by the following formula, and having a composition mole ratio of each unit of 50:25:25, and having a weight-average molecular weight of about 7,500 was obtained. The resulting copolymer is referred to as resin J.

and the resist layer corresponding to the outer frame remains after exposure and development, thus providing a pattern. After exposure, post exposure bake (PEB) was conducted on a hot plate at the temperatures shown in Table 1 for 60 seconds. Further, paddle development was conducted with a 2.38% by weight aqueous solution of tetramethylammoniumhydroxide for 60 seconds. The pattern obtained from the resist film provided on an organic antireflection film substrate was observed by a scanning electron microscope to determine its effective sensitivity and resolution according to the following methods.

Effective sensitivity: shown by the irradiation amount whereby a 0.3 μm line-and-space pattern is formed at 1:1 when a rectile of a dark field pattern is used, and when a rectile of a bright filed pattern is used.

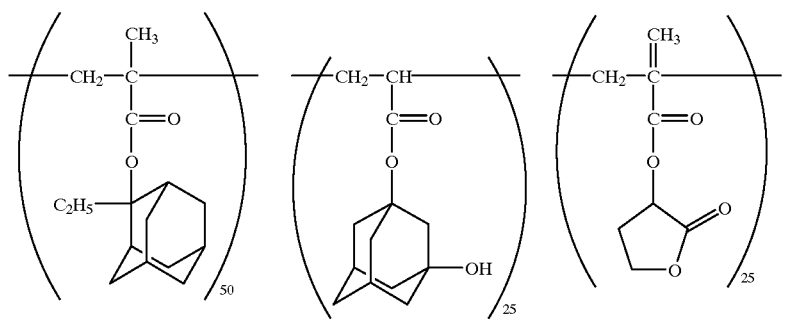

Examples 1 and 2

10 parts of the resin D or E, 0.2 part of p-tolyldiphenylsulfonium trifluoromethanesulfonate ("MDS-205" manufactured by MIDORI Chemical K. K.) as an acid generator, and 0.015 part of 2,6-diisopropylaniline as a quencher were dissolved in 45 parts of 2-heptanone. The resulting solution was filtered through a filter made of a fluorine resin with a pore diameter of 0.2 μm to prepare a resist solution. The resist solution thus prepared was applied onto a silicon wafer (contact angle of water: 50°) which had been subjected to a treatment with hexamethylsilazane at 23° C. for 20 seconds, and a silicon wafer coated with an organic antireflection film thereon so that the film thickness after drying was 0.5 μm. The organic antireflection film was formed by applying "DUV-42" manufactured by Brewer Co., under the baking conditions of 215 ° C. for 60 seconds so that the thickness was 570 0̸. Prebake after application of the resist solution was conducted under the conditions of 120° C. for 60 seconds on a direct hot plate.

The wafer on which a resist film was thus formed was exposed to light through a line-and-space pattern with changing the irradiation amount stepwise by using a KrF excimer stepper ["NSR 2205 EX12B" manufactured by Nikon Corp., NA=0.55, σ=0.8]. The exposure of the line-and-space pattern was conducted by using two kinds of reticles (masks) of a dark-field pattern and a bright field pattern. In the reticle of a dark field pattern herein cited, only the space part of a resist pattern is made of a glass surface, while all of the other parts are made of a chrome surface. Accordingly, the whole periphery of the line-and-space pattern remains as a resist layer after exposure and development, thus providing a pattern. Whereas in the rectile of a bright field pattern, a pattern is formed such that the outer frame is made of a chrome surface, while the line part of the resist pattern is made of a chrome layer using a glass surface as a base within the frame. Accordingly, the resist layer around the line-and-space pattern is removed, Resolution: shown by the minimum dimension of a line-and-space pattern separated at the irradiation amount of the effective sensitivity when a rectile of a dark field pattern is used, and when a rectile of a bright filed pattern is used.

The pattern on a substrate on which an organic antireflection was not provided was evaluated for its adhesion. Namely, the resist film formed on a substrate not having organic antireflection film was exposed to light at the effective sensitivity obtained on the above-described organic antireflection film. Then, the pattern after development was observed by a scanning electron microscope. If the resist film corresponding to the outer frame of a bright field pattern remains as the pattern of the rectile, adheres to the substrate is shown with "○". If even a part of the resist film corresponding to the outer frame is peeled and become chipped, adheres to the substrate is shown with "X". The foregoing results are shown in Table 1 with the kind of each resin used.

TABLE 1

| Example No. | Resin | PEB | Effective sensitivity (mj/cm²) Dark | Bright | Resolution (μm) Dark | Bright | Adhesion |
|---|---|---|---|---|---|---|---|
| 1 | D | 120° C. | 22 | 22 | 0.22 | 0.21 | ○ |
| 2 | E | 100° C. | 46 | 44 | 0.19 | 0.18 | ○ |

Examples 3 to 8 and Comparative Examples 1 and 2

Resist solutions were prepared in the same manner as in Example 1, except that resin E was replaced with 10 parts of the resins shown in Table 2, which do not contain maleic anhydride units, and the solvent was changed into a mixed solvent of 47.5 parts of propylene glycol monomethyl ether acetate and 2.5 parts of γ-butyrolactone. The procedures of Example 1 were basically repeated using these resist solutions, but the organic antireflection films were formed as mentioned below and the PEB was conducted at the temperatures shown in Table 2. As for Examples 3, 5, and 6, and Comparative Example 1, the "DUV-42" manufactured by Brewer Co., was applied so that the thickness was 570 Å under a bake condition of 215° C. for 60 seconds as in Examples 1 and 2. As for Examples 4, 7, and 8, and Comparative Example 2, "DUV-30-16" manufactured by Brewer Co., was applied so that the thickness was 1600 Å under a bake condition of 215° C. for 60 seconds. The obtained results are shown in Table 2 with the kind of the resins used. In some patters shown with "X" the line-and-space patterns are apparently peeled.

NA=0.55, σ=0.6]. After exposure, post exposure bake (PEB) was conducted on a hot plate at the temperatures shown in Table 1 for 60 seconds. Further, paddle development was conducted with a 2.38% by weight aqueous solution of tetramethylammoniumhydroxide for 60 seconds. The bright field pattern after the development was observed by a scanning electron microscope to determine its effective sensitivity and resolution according to the following methods.

Effective sensitivity: shown by the irradiation amount whereby a 0.18 μm line-and-space pattern is formed at 1:1.

Resolution: shown by the minimum dimension of a line-and-space pattern separated at the irradiation amount of the effective sensitivity.

TABLE 2

| Example No. | Resin | Antireflection film | PEB | Effective sensitivity (mj/cm²) Dark | Effective sensitivity (mj/cm²) Bright | Resolution (μm) Dark | Resolution (μm) Bright | Adhesion |
|---|---|---|---|---|---|---|---|---|
| 3 | A | DUV-42 | 120° C. | 38 | 36 | 0.24 | 0.21 | ○ |
| 4 | C | DUV-30-16 | 120° C. | 20 | 20 | 0.22 | 0.21 | ○ |
| 5 | F | DUV-42 | 100° C. | 42 | 44 | 0.22 | 0.18 | ○ |
| 6 | G | DUV-42 | 80° C. | 24 | 24 | 0.20 | 0.20 | ○ |
| 7 | H | DUV-30-16 | 120° C. | 32 | 30 | 0.21 | 0.19 | ○ |
| 8 | r | DUV-30-16 | 110° C. | 22 | 22 | 0.22 | 0.21 | ○ |
| Comparative 1 | X | DUV-42 | 120° C. | 26 | 28 | 0.24 | 0.21 | X |
| Comparative 2 | X | DUV-30-16 | 120° C. | 26 | 24 | 0.24 | 0.21 | X |

As shown in Tables 1 and 2, the resists using the resins specified in the present invention do not cause peeling of a pattern at the time of development, and are excellent in adhension to a substrate. The resolution is also good. Particularly, the resists of Examples 1 and 2, and 4 to 8 using a resin having a unit of 2-ethyl-2-adamantyl methacrylate are improved in resolution as compared with the resists of Comparative Examples. The resist of the present invention is also good in dry etching resistance while not being largely impaired in sensitivity.

Examples 9 to 11 and Comparative Examples 3

10 parts of the resin shown in Table 3, 0.2 part of p-tolyldiphenylsulfonium perfluoroctanesulfonate as an acid generator, and 0.0075 part of 2,6-diisopropylaniline as a quencher were dissolved in a mixed solvent of 57 parts of propylene glycol monomethyl ether acetate and 3 parts of γ-butyrolactone. The resulting solution was filtered through a filter made of a fluorine resin with a pore diameter of 0.2 μm to prepare a resist solution. The resist solution thus prepared was applied onto a silicon wafer coated with an organic antireflection film thereon so that the film thickness after drying was 0.39 μm. The organic antireflection film was formed by applying "DUV-30-16" manufactured by Brewer Co., under the baking conditions of 215° C. for 60 seconds so that the thickness was 1600 Å. Prebake after application of the resist solution was conducted for 60 seconds on a direct hot plate at a temperature shown in Table 3.

The wafer on which a resist film was thus formed was exposed to light through a line-and-space pattern with changing the irradiation amount stepwise by using a ArF excimer stepper ["NSR ArF" manufactured by Nikon Corp.,

TABLE 3

| Example No. | Resin | Prebake Temp. | PEB Temp. | Effective sensitivity (mj/cm²) | Resolution (μm) |
|---|---|---|---|---|---|
| 9 | J | 130° C. | 115° C. | 25 | 0.15 |
| 10 | C | 130° C. | 130° C. | 21 | 0.15 |
| 11 | A | 150° C. | 140° C. | 24 | 0.15 |
| Comparative 3 | X | 130° C. | 130° C. | 32 | 0.16 |

As shown in Table 3, the resists using the resins specified in the present invention are superior in sensitivity and resolution to the resist of Comparative Example 3. It is shown that the resist composition of the present invention exhibit excellent performances as a resist even when the exposure is conducted by using an ArF excimer laser exposure machine.

The chemical amplifying type positive resist composition of the present invention is excellent in adhesion to a substrate, and is also good in resist performances such as dry etching resistance, sensitivity, and resolution. Accordingly, the composition is suitable for exposure using a KrF excimer laser, ArF excimer laser, or the like, thereby providing a high performance resist pattern

What is claimed is:

1. A chemical amplifying type positive resist composition which comprises a resin(1) having a polymerization unit represented by the following formula (I):

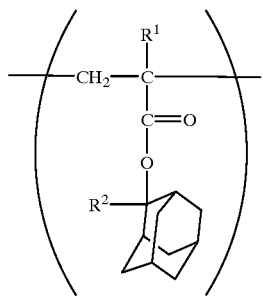

(I)

wherein R¹ represents hydrogen or methyl, and R² represents alkyl, and a polymerization unit of a monomer selected from 3-hydroxy-1-adamantyl (meth)acrylate and (meth)acrylonitrile;

and an acid generator.

2. A chemical amplifying type positive resist composition according to claim 1 wherein the resin(1) is obtained by a copolymerization of monomers which comprises 30 to 80 mol % of 2-alkyl-2-adamantyl (meth)acrylate and 20 to 70 mol % of mixture of 3-hydroxy-1-adamantyl (meth)acrylate and (meth)acrylonitrile.

3. A chemical amplifying type positive resist composition according to claim 1 wherein the resin(1) further has at least one polymerization unit selected from a polymerization unit of α-methacryloyloxy-γ-butyrolactone or a polymerization unit of maleic anhydride.

4. A chemical amplifying type positive resist composition according to claim 3 wherein the resin(1) is obtained by a copolymerization of monomers which comprises 30 to 80 mol % of 2-alkyl-2-adamantyl (meth)acrylate and 20 to 70 mol % of mixture of 3-hydroxy-1-adamantyl (meth)acrylate, (meth)acrylonitrile, α-methacryloyloxy-γ-butyrolactone and maleic anhydride.

5. A chemical amplifying type positive resist composition according to claim 3 wherein the resin(1) has a polymerization unit of 2-alkyl-2-adamantyl (meth)acrylate, a polymerization unit of 3-hydroxy-1-adamantyl (meth)acrylate and a polymerization unit of α-methacryloyloxy-γ-butyrolactone.

6. A chemical amplifying type positive resist composition according to claim 1, wherein R¹ is methyl and R² is ethyl.

7. A chemical amplifying type positive resist composition which comprises a resin(2) having a polymerization unit of 2-ethyl-2-adamantyl methacrylate, and a polymerization unit of a monomer selected from 3-hydroxy-1-adamantyl (meth) acrylate, (meth)acrylonitrile, α-methacryloyloxy-γ-butyrolactone and maleic anhydride;

and an acid generator.

8. A chemical amplifying type positive resist composition according to claim 7 wherein the resin(2) is obtained by a copolymerization of monomers which comprises 30 to 80 mol % of 2-ethyl-2-adamantyl (meth)acrylate and 20 to 70 mol % of mixture of 3-hydroxy-1-adamantyl (meth)acrylate, (meth)acrylonitrile, α-methacryloyloxy-γ-butyrolactone and maleic anhydride.

9. A chemical amplifying type positive resist composition according to claim 7 wherein the resin(2) has a polymerization unit of 2-ethyl-2-adamantyl methacrylate and a polymerization unit of 3-hydroxy-1-adamantyl (meth)acrylate.

10. A chemical amplifying type positive resist composition according to claim 7 wherein the resin(2) has a polymerization unit of 2-ethyl-2-adamantyl methacrylate, and a polymerization unit of α-methacryloyloxy-γ-butyrolactone.

11. A chemical amplifying type positive resist composition according to claim 10 wherein the resin(2) further has a polymerization unit of 3-hydroxy-1-adamantyl (meth) acrylate.

12. A chemical amplifying type positive resist composition according to claim 7 wherein the resin(2) further has a polymerization unit represented by the following formula (I):

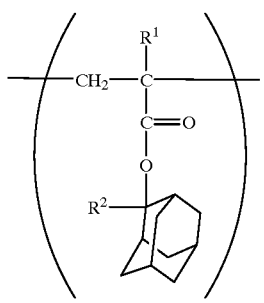

(I)

wherein R¹ represents hydrogen or methyl, and R² represents alkyl, provided that the polymerization unit represented by the formula (I) is not the polymerization unit of 2-ethyl-2-adamantyl methacrylate.

13. A chemical amplifying type positive resist composition according to claim 12 wherein the resin(2) is obtained by a copolymerization of monomers which comprises 30 to 80 mol % of 2-alkyl-2-adamantyl (meth)acrylate, in which the amount of 2-ethyl-2-adamantyl methacrylate is present and its amount is 20 mol % or more and 20 to 70 mol % of mixture of 3-hydroxy-1-adamantyl (meth)acrylate, (meth)acrylonitrile, α-methacryloyloxy-γ-butyrolactone and maleic anhydride.

14. A chemical amplifying type positive resist composition according to claim 1 and 7 which further comprises an amine as a quencher.

15. A chemical amplifying type positive resist composition according to claim 1, wherein the resin (1) further has a polymerization unit of maleic anhydride.

16. A chemical amplifying type positive resist composition which comprises a resin (2) having a polymerization unit of 2-ethyl-2-adamantylmethacrylate, and a polymerization unit of a monomer selected from 3-hydroxyl-1-adamantyl (meth)acrylate, (meth)acrylonitrile, and maleic anhydride;

and an acid generator.

* * * * *